(12) United States Patent
Adlerstein et al.

(10) Patent No.: US 7,030,600 B2
(45) Date of Patent: Apr. 18, 2006

(54) BROADBAND MICROWAVE POWER SENSOR

(75) Inventors: Michael G. Adlerstein, Wellesley, MA (US); Katherine J. Herrick, Westford, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 10/701,044

(22) Filed: Nov. 4, 2003

(65) Prior Publication Data

US 2005/0093532 A1 May 5, 2005

(51) Int. Cl.
*G01S 3/02* (2006.01)
(52) U.S. Cl. .................... 324/76.14; 324/725
(58) Field of Classification Search ........... 315/5.41, 315/5.42; 250/266, 269; 73/118.2, 170.12; 324/725, 76.14, 71.1
See application file for complete search history.

(56) References Cited

U.S. PATENT DOCUMENTS

| | | | |
|---|---|---|---|
| 2,432,199 A | | 12/1947 | Kamm |
| 3,091,985 A | | 6/1963 | Strickland |
| 3,517,555 A | | 6/1970 | Strickland |
| 3,908,164 A | | 9/1975 | Parker |
| 3,928,800 A | | 12/1975 | Strenglein |
| 4,713,581 A | * | 12/1987 | Haimson ............... 315/5.41 |
| 4,793,182 A | * | 12/1988 | Djorup .................. 73/335.02 |
| 4,936,144 A | | 6/1990 | Djorup .................. 73/170.12 |
| 5,681,989 A | * | 10/1997 | Kanke et al. ............. 73/118.2 |
| 6,198,296 B1 | * | 3/2001 | Ivanov .................... 324/725 |
| 6,384,787 B1 | | 5/2002 | Kim et al. ............. 343/700 M |
| 6,486,679 B1 | * | 11/2002 | Holt ........................ 324/610 |
| 2001/0036758 A1 | | 11/2001 | Furukawa | |

FOREIGN PATENT DOCUMENTS

| | | |
|---|---|---|
| EP | 54167961 | 12/1979 |
| EP | 1 460 437 A1 | 3/2003 |
| JP | 56090264 | 3/2003 |

OTHER PUBLICATIONS

Google search definitions of Wheatstone bridge on the web define: Wheatstone bridge.*
David M. Pozar, Design of Millimeter Wave Microstrip Reflectarrays, Feb. 1997. pp. 287-296, vol. 45, No. 2.
Marek E. Bialkowski, Design, Development, and Testing of X-Band Amplifying Reflectarrays, Aug. 2002, pp. 1065-1076, vol. 50, No. 8.
"Power Measurement Basics," Agilent Technologies (3 pages).
Coplanar Waveguides Supported by InGaP and GaAs/AlGaAs Membrane-Like Bridges, http://www.elu.sav.sk/dept/oms/nato/md.html, May 8, 2003 (3 pages).

* cited by examiner

*Primary Examiner*—Vincent Q. Nguyen
(74) *Attorney, Agent, or Firm*—Daly,Crowley,Mofford & Durkee,LLP

(57) ABSTRACT

A circuit for sensing radio frequency energy. The circuit includes a Wheatstone bridge having at least one element thereof thermally responsive to the radio frequency energy passing therethough differently from radio frequency energy passing though at least one other element of the bridge.

19 Claims, 5 Drawing Sheets

BROADBAND MICROWAVE POWER SENSOR

TECHNICAL FIELD

This invention relates to power sensors, and more particularly to microwave power sensors.

BACKGROUND

As is known there is a requirement for highly linear radio frequency (RF) energy power sensors which can be integrated on Microwave Monolithic Integrated Circuits (MMICs). One such requirement is associated with of a radio frequency (RF) amplifiers. In such an amplifier, a directional coupler is used to detect power reflected from an input tuner. A second coupler is used at the output to detect output power. An algorithm is used to provide automatic tuning in conjunction with outputs from other sensors on the chip. The operation of such a circuit is greatly simplified by use of detectors whose output is linear with power.

It is also preferred that these detectors, and their matching circuitry, be broadband to allow use over a wide range of frequencies. Broadband detectors can also be used to assess the input frequency band for a given signal. Here, several broadband power sensors are used to detect power in each of a plurality of smaller frequency bands. The couplers incorporate specific filtering to indicate the frequency detected.

A common detector implementation utilizes a Schottky diode. The diode is biased at a fixed forward dc current. The dc voltage required to maintain this current changes upon application of an RF signal. The effect relies upon the inherent non-linearity of the diode and is therefore very dependent on the power level applied. Any algorithm which utilizes the output of the diode must account for this non-linearity. This adds considerable burden to the process. It may also be necessary to calibrate individual detectors in order to maintain the robustness of the algorithm. The requirement of narrow band tuning circuits is an additional disadvantage of diode detectors. The output of such sensors will also be sensitive to the ambient temperature.

SUMMARY

In accordance with the present invention, a circuit is provided for sensing radio frequency energy. The circuit includes a Wheatstone bridge having at least one element thereof thermally responsive to the radio frequency energy passing therethough differently from radio frequency energy passing though at least one other element of the bridge.

In one embodiment, the Wheatstone bridge has a pair of parallel circuit paths disposed between a pair of input nodes, each path having a pair of serially connected sections, each pair of sections in each one of the paths being connected at a corresponding one of a pair of output nodes, at least one section in a first one of the pair of paths being thermally responsive to the radio frequency energy passing therethough differently from radio frequency energy passing though at least one other section element in the other one of the pair of paths.

In one embodiment, a first one of the input nodes is coupled to a source of the radio frequency energy and to a source of dc voltage.

In one embodiment, the circuit includes a feedback loop responsive to a voltage produced across the output node for providing a control voltage to the first one of the pair of input node.

In one embodiment, the first one of the paths includes a capacitor disposed in shunt with an electrical element having an electrical property varying with the radio frequency energy passing through such electrical element.

In one embodiment, the electrical property is electrical resistance.

In accordance with another feature of the invention, a circuit is provided for sensing radio frequency energy. The circuit includes a Wheatstone bridge having a pair of parallel circuit paths disposed between a pair of input nodes, each path having a pair of serially connected elements, each pair of elements in each one of the paths being connected at a corresponding one of a pair of output nodes, at least one element in a first one of the pair of paths being thermally responsive to the power passing therethough differently from power passing though at least one other element in the other one of the pair of path. A first one of the input nodes is coupled to a source of the radio frequency energy and to a source of dc voltage. A feedback loop is responsive to a voltage produced across the output node for providing a control voltage to the first one of the pair of input node.

In one embodiment, the first one of the paths includes a capacitor disposed in shunt with an electrical element having an electrical property varying with the radio frequency energy passing through such electrical element.

In one embodiment, the electrical property is electrical resistance.

In one embodiment, the electrical property is thermal sensitivity.

In accordance with yet another feature of the invention, a method is provided for sensing power. The method includes providing a Wheatstone bridge having: a pair of parallel circuit paths disposed between a pair of input nodes, each path having a pair of serially connected sections, each pair of sections in each one of the paths being connected at a corresponding one of a pair of output nodes, at least one section in a first one of the pair of paths being thermally responsive to the power passing therethough differently from power passing though at least one other section element in the other one of the pair of paths and wherein a first one of the input nodes is coupled to a source of the radio frequency energy and to a source of dc voltage; and a feedback loop responsive to a voltage produced across the output node for providing a control voltage to the first one of the pair of input nodes. Next, a first type of power is applied to the bridge with the feedback loop providing a voltage to the first one of the node and with such bridge being in a balanced condition the bridge. Next, a second type of power to the bridge with the bridge becoming imbalanced from such applied second power and with the feedback loop changing the voltage to the first node, such changed voltage providing an indication of presence of the applied second type of power.

In one embodiment, the first type of power is dc power and the second power is RF power.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
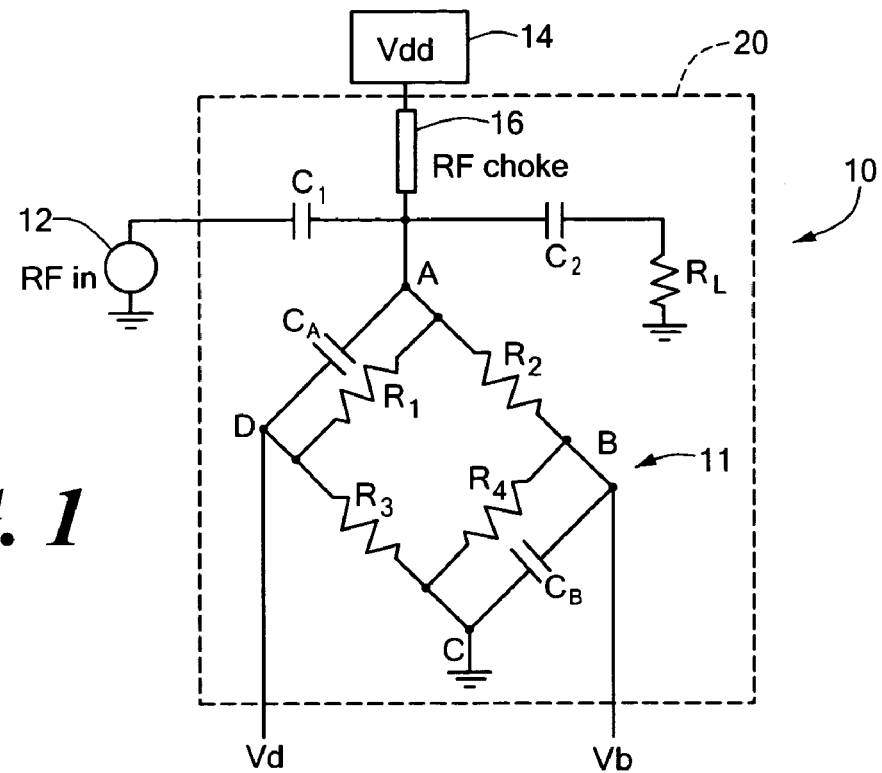
FIG. 1 is a schematic diagram of an RF power detection circuit according to the invention.

Referring now to FIG. 1, an RF power detection circuit 10 is shown which utilizes thin film thermistors R1, R2, R3 and R4, in a Wheatstone bridge 11 configuration. Resistors R2 and R3 may be considered as detector resistors and R1 and R4 may be considered as reference resistors.

The operation of the circuit 10 is described as follows. It is noted that resistor R1 is connected between nodes A and D. Resistor R2 is connected between nodes A and B. Resistor R3 is connected between nodes D and C. And, Resistor R4 is connected between nodes B and C. All the resistors in the circuit 10 are made of the same material, here, for example tantalum, which can be deposited on the planar surface of a monolithic circuit. Further, the resistors R1 through R4 are thermistors, that is, the resistance thereof is a function of their temperature.

It is noted that the resistors R1 and R4 are shunted by capacitors $C_A$ and $C_B$, respectively, as shown. Further, Node A is coupled to: an RF input voltage 12 through a capacitor C1; a load RL, through a capacitor; and, a dc voltage source 14 though an RF choke 16.

Under a dc bias provided by dc source 14, and in the absence of RF input, the values of resistors R1 and R2 are set to be equal to each other. The values of R3 and R4 are also set to be equal. Accordingly, the nodes D and B are at the same potential, i.e., $$Vout = Vd - Vb = \frac{(R3R2 - R4R1)}{(R1+R3)(R2+R4)} Vdc \quad \text{Equation 1}$$

This potential remains at zero even if the temperature of the substrate 20, upon which they are disposed, varies because the temperature coefficients of resistance for the resistors R1 through R4 are equal. Therefore, the ratio of the resistor values of resistors R1 through R4 will stay the same in the absence of RF input power.

Upon application of the RF input power, RF current divides equally between the two parallel elements of the bridge 11; equally through the element having resistors R1 and R3 and the element having the resistors R2 R4. However, resistor R1 and R4 are bypassed (i.e., shunted) with the capacitors $C_A$ and $C_B$, respectively. These resistors R1 and R4 will therefore heat less than resistors R2 and R3 because the resistors R1 and R4 receive additional heating from the RF power passing through such resistors R2 and R3. That is, resistors R2 and R3 become heated by both the dc power and RF power, whereas resistors R1 and R4 become heated from only the dc power. Because R2 and R3 become heated by both the dc power and RF power their resistance will increase greater than any increase in resistance of resistors R1 and R4 which become heated from only the dc power. This will result in a resistance imbalance in the bridge 11; i.e., the voltage between nodes B and D will increase from zero. Assuming a positive temperature coefficient (i.e., the change in the resistance of the resistors R2 and R4 is positive, dR/dT>0), the result will be that the potential at node D will rise toward the positive rail $V_{dc}$ and the potential at node B will move toward dc ground potential resulting in $(V_d - V_b) > 0$.

Close to balance, the response of the bridge is highly linear and is obtained by differentiating Equation 1 with respect to the resistances. One then evokes the relationships between the resistors needed for bridge balance. The change in output voltage due to change $\delta R_2$ and $\delta R_4$ in the resistances is given by $$\delta V_{out} = \frac{(2 \cdot R_2 \cdot R_3)}{(R_1 + R_3) \cdot (R_2 + R_4)} \cdot \left( \frac{\delta R_2}{R_2} - \frac{\delta R_4}{R_4} \right) \quad \text{Equation 2}$$

If similar materials are used for the resistors, it is evident that ambient heating will give no change in the output voltage. On the other hand, any process such as RF heating which effects the resistors differently will result in a change in $V_{out}$. The output is linear with heating and is devoid of a DC output offset which would interfere with subsequent amplification.

Figure 2:
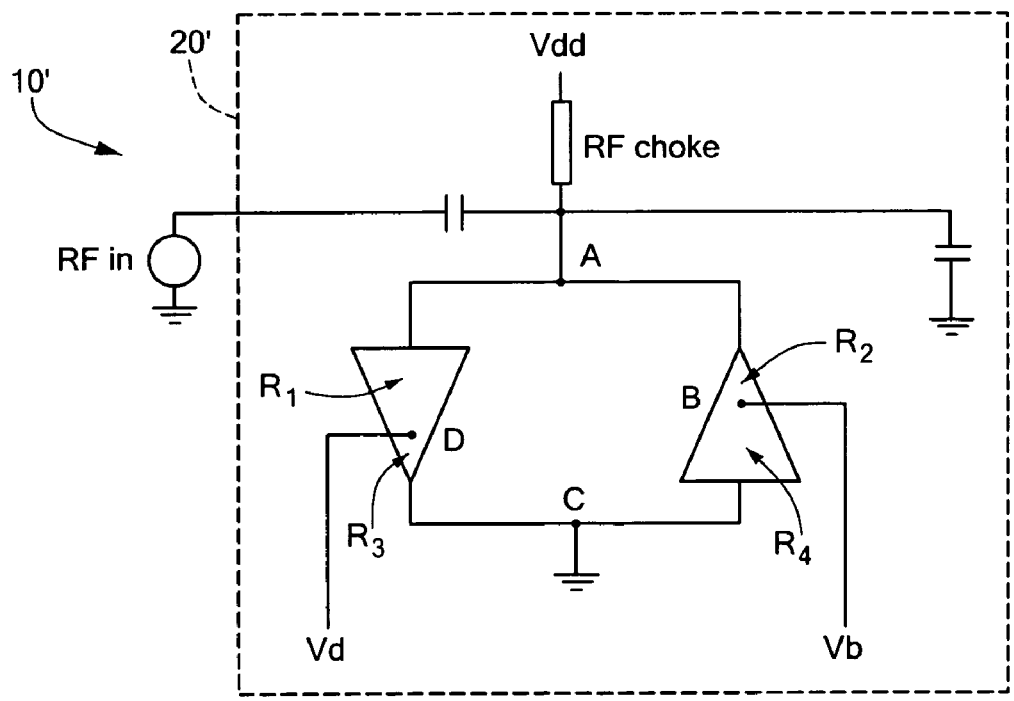
FIG. 2 is a schematic diagram of an RF power detection circuit according to another embodiment of the invention.

Referring now to FIG. 2, a distributed implementation for the resistors R1 through R4 is shown. The performance of the structure shown in FIG. 2 depends upon the materials used for the resistors R1 through R4 and their thermal properties of the substrate upon which they are deposited. Design parameters will influence the not only the sensitivity of the circuit but also the response time constant. There will be tradeoffs between a rapid response to increasing RF power (dictating a thermally isolated design) and the response to falling RF power (dictating a circuit tightly coupled to it's thermal environment).

Resistors R'2 and R'3 may be considered as detector resistors and R'1 and R'4 may be considered as reference resistors.

The broadest bandwidth can be achieved using a distributed design for the thermal bridge sensor such the design shown in FIG. 2. Here shunt capacitors are not needed. More particularly, the capacitors are not needed with the tapered resistor for the following reason: First we apply a DC current to the pair of resistors at the DC input. Such current flows uniformly through the cross-section of the resistors. This creates a particular voltage drop along the length of the tapers. Most of the drop occurs at the narrow ends of the tapers, so if points B and D seek a point where the potentials are equal, they will generally be offset from the centers of the tapers. There will be many such pairs of balance points for the DC case, but one pair is selected which balances the bridge. Now an RF current is introduced. Because RF currents tend to flow on the edges of the resistors, heating due to the RF current will be different from the DC current thereby causing an imbalance between points B and D. The imbalance is the detected output. To use the tapered structure in a feedback loop, to be described in connection with FIG. 3, it must be established that there is a stable solution to the equations. Also, there may be some requirements for matching the wide end of the tapers to RF. One could use a diamond shape taper with two pointed ends, for example.

In this approach, two planar resistors R'1, R'3 and R'2, R'4 are deposited on the substrate 20'. These resistors R'1, R'3 and R'2, R'4 each have a triangular shape oriented as shown in FIG. 2. Under dc bias only, there is non-uniform heating of the resistors R'1, R'3 and R'2, R'4 so that there will be a current and temperature distribution along the central axis of the resistive structures. The points of nodes D and B are established so that the bridge is balanced in the absence of RF input.

When RF input is applied, the distribution of RF currents will differ from the dc current distribution. The result will be a non-uniform temperature profile which differs from the dc situation. This effect will unbalance the bridge and result in a detected signal.

Thus, with either the circuit 10 (FIG. 1) or the circuit 10' (FIG. 2), the resistance of resistors R2 and R3 change to a greater degree to both the RF power and the dc power than change in the resistance of resistors R1 and R4. In circuit 10, this results from the different shape of the resistors.

More generally, however, it is desired that the resistance of resistors R2 and R3 change with applied RF power differently than the change in resistance of resistors R1 and R4.

Figure 3:
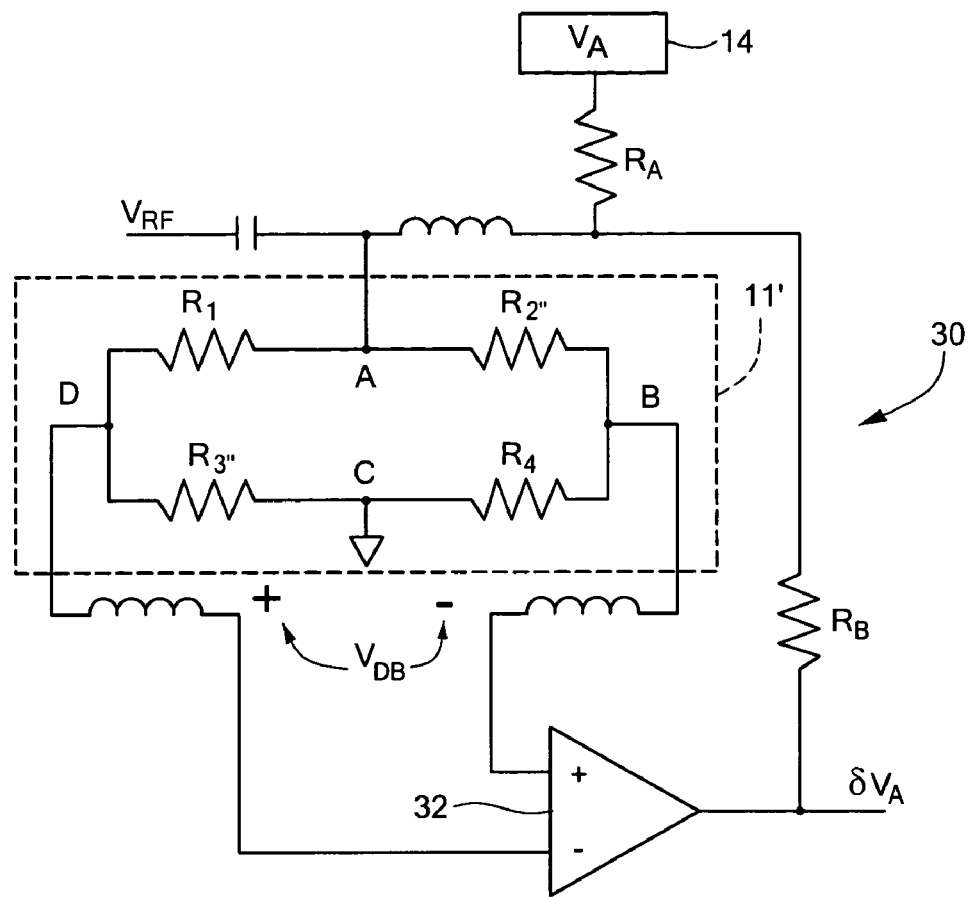
FIG. 3 is a schematic diagram of an RF power detection circuit according to still another embodiment of the invention.

A generalized bridge circuit which allows both applied DC bias and RF input is shown in FIG. 3. In general the resistors are not equal in value. We will consider various combinations to meet the needs of our detection scheme.

The arrangement of the resistors is such that the resistance of R2 and R3 change differently in response to the application of either RF or DC power than the change in the resistance of resistors R1 and R2. Resistors R2 and R3 may be considered as detector resistors and R1 and R4 may be considered as reference resistors.

Substitution into Equation 2 shows that the relative output voltage of the bridge around balance to power dissipation within it is given by:

$$\frac{V_d - V_b}{V_a - V_c} = \frac{2}{4} \frac{(R3R2\kappa_3\theta_3 - R1R4\kappa_1\theta_1)}{[(R1+R3)(R2+R4)]} \delta P \qquad \text{Equation (3)}$$

Here, we have set $\delta R_2 = R_2 \kappa_{22} \theta_2 P/4$ where $\theta_2$ (units of 1/deg) is the sensitivity temperature and $\theta_2$ is the thermal resistance of the resistor in deg/W. $\delta P$ is the change in RF power absorbed by the circuit.

As noted above, it is desired that the resistance of resistors R2 and R3 change with either applied RF power or dc power differently than the change in resistance of resistors R1 and R4. This may be accomplished in a variety of ways. For example, the resistors R2 and R3 may be made of a different material than resistors R1 and R4, i.e., in such case the parameter $\kappa$ will be different, where $\kappa$ is the fractional change in resistance per degree. Or, the resistors R2 and R3 may have a different geometry than the geometry of resistors R1 and R4, i.e., in such case the parameter $\theta$ will be different, where $\theta$ is the thermal resistance. Or, the resistors R2 and R3 may be spread out over a larger surface area of the substrate that than resistors R1 and R4, in which case the parameter $\theta$ will be different. Or, the resistors R2 and R3 may be made elevated from the surface of the substrate by, for example, an air bridge, whereas resistors R1 and R4 are disposed on a thin insulator on the surface of the substrate, in which case the parameter $\theta$ will be different. Or, the resistors R2 and R3 may formed on a different insulating material on the surface of the substrate than resistors R1 and R4 in which case the parameter $\theta$ will be different. Or, the resistors R2 and R3 may formed on an insulating material on the surface having a different thickness than resistors R1 and R4, in which case the parameter $\theta$ will be different.

Analysis shows that under certain conditions on the thermal resistance and temperature sensitivity of the bridge resistors, a dynamically balanced bridge circuit 30 can be constructed as shown in FIG. 3. Here, the operational amplifier 32 dynamically balances the Wheatstone bridge 11" through the inherent differences in thermal resistance or thermal sensitivity of the resistors R2, R3 and resistors R1, R4.

Initially, with the RF power removed and with only the dc power applied, the bridge 11" is balanced. That is, the bridge 11" is formed so that in the absence of RF power and with only dc power, the resistors R1, R2, R3 and R4 are selected so that there is no potential difference between nodes B and D, i.e., $(V_d - V_b) = 0$, i.e., the Wheatstone bridge is balanced.

It is noted that the dc voltage source 14, producing voltage Va, is coupled to node A through a resistor RA and that the output of the operational amplifier 32, i.e., the voltage $\delta V_a$, i.e., the output voltage of the operational amplifier 32, is coupled to node A through resistor RB. This, the voltage at node A is equal $$R_C \cdot \frac{R_B \cdot V_A + R_A \cdot \delta V_A}{R_A \cdot R_B + R_C \cdot (R_A + R_B)}$$

Where $R_C$ represents the net resistance between point A and point C resulting from the series and parallel combination of the bridge network resistors.

With the only the dc power applied, the bridge is balanced the voltage at the output of the operational amplifier 32, $\delta V_a$, is zero.

Next, the RF power is applied. Because of the different resistors R1 and R4 will heat differently from the heating of resistors R2 and R3, the resistance of resistors R1 and R4 will change differently from the resistance of resistors R2 and R3. Thus, after the RF power is applied, the resistance of resistors R1 and R4 will change differently from the resistance of resistors R2 and R3. For example, assume that the resistors R2 and R3 are elevated from the surface of the substrate, these resistors R2 and R3 will not dissipate heat to the substrate as rapidly as resistors R1 and R4. Therefore, $\theta_2 > \theta_4$ Thus, resistors R2 and R3 will heat more than the resistors R1 and R4. Thus, the resistance of resistors R2 and R3 will increase more than the resistors R1 and R4. As a result, the bridge becomes imbalance, i.e., the voltage between nodes B and D, i.e., $(V_d - V_b) \neq 0$.

The operational amplifier 32 responds to the bridge imbalance and the output voltage thereof, i.e., $\delta V_a$, increases or decreases from zero to dynamically to rebalance the bridge 11" by changing the voltage at node A. The output voltage $\delta V_a$ thus now relates directly to the dissipated, applied, RF power and hence $\delta V_a$ provides a measure of the applied RF power. By maintaining the bridge in a state of dynamic balance, small departures from steady state can be detected on any desired time scale by monitoring $\delta V_a$. Changes in $\delta V_a$ on a short time scale would be a response to the mere onset of a change in the RF power impinging on the circuit.

This closed loop RF detector arrangement can be made insensitive to changes in ambient temperature if the resistors R1, R4 and R2, R3 satisfy the following conditions:

1. The values of the product κθ differ for the reference resistors R1, R4 versus detector resistors R2, R4.
2. The initial values of electrical resistance differ for the reference resistors R1, R4 versus detector resistors R2, R4.
3. All resistors R1, R3 and R2, R4 are made of the same material with identical values of κ, where κ, is the temperature coefficient of resistance change. This implies that the reference resistors R1, R3 and the detector resistors R2, R4 have different thermal resistance.
4. The product γθ (which is the thermalization time constant in seconds) is the same for all the resistors where γ is the resistor heat capacity.

Figure 4:
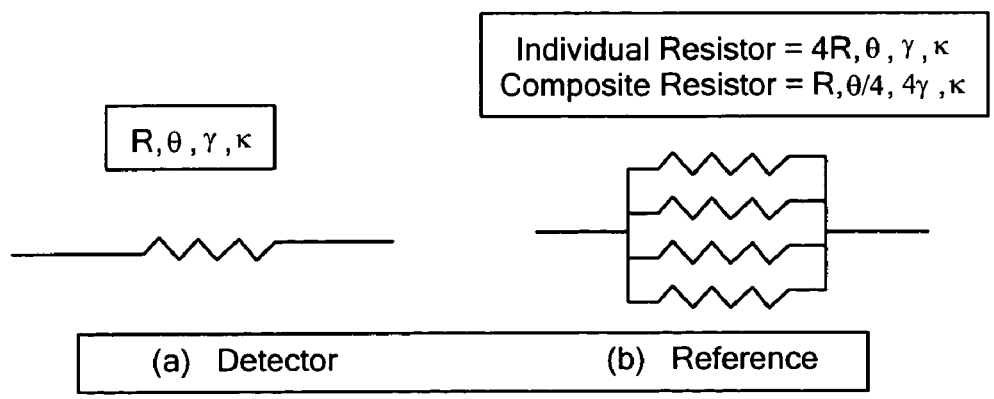
FIG. 4 show resistors connected in parallel having the same resistance and κ value but lower thermal resistance compared with a single resistor.

A practical implementation of these conditions might be achieved using the resistor designs shown in FIG. 4. It is noted that by spreading out the reference resistor, R1, for example, the thermal resistance is reduced making it less sensitive to dissipated DC or RF power than a sensitive resistor R3, for example. The thermal time constant of the reference resistor R1 is approximately the same as the detector resistor due to the differences in heat capacity. One of the possible advantages of using the resistor designs above is that no reactive components are needed to distinguish the detector and reference resistors. Hence, the design could have very broadband applicability.

Figure 5:
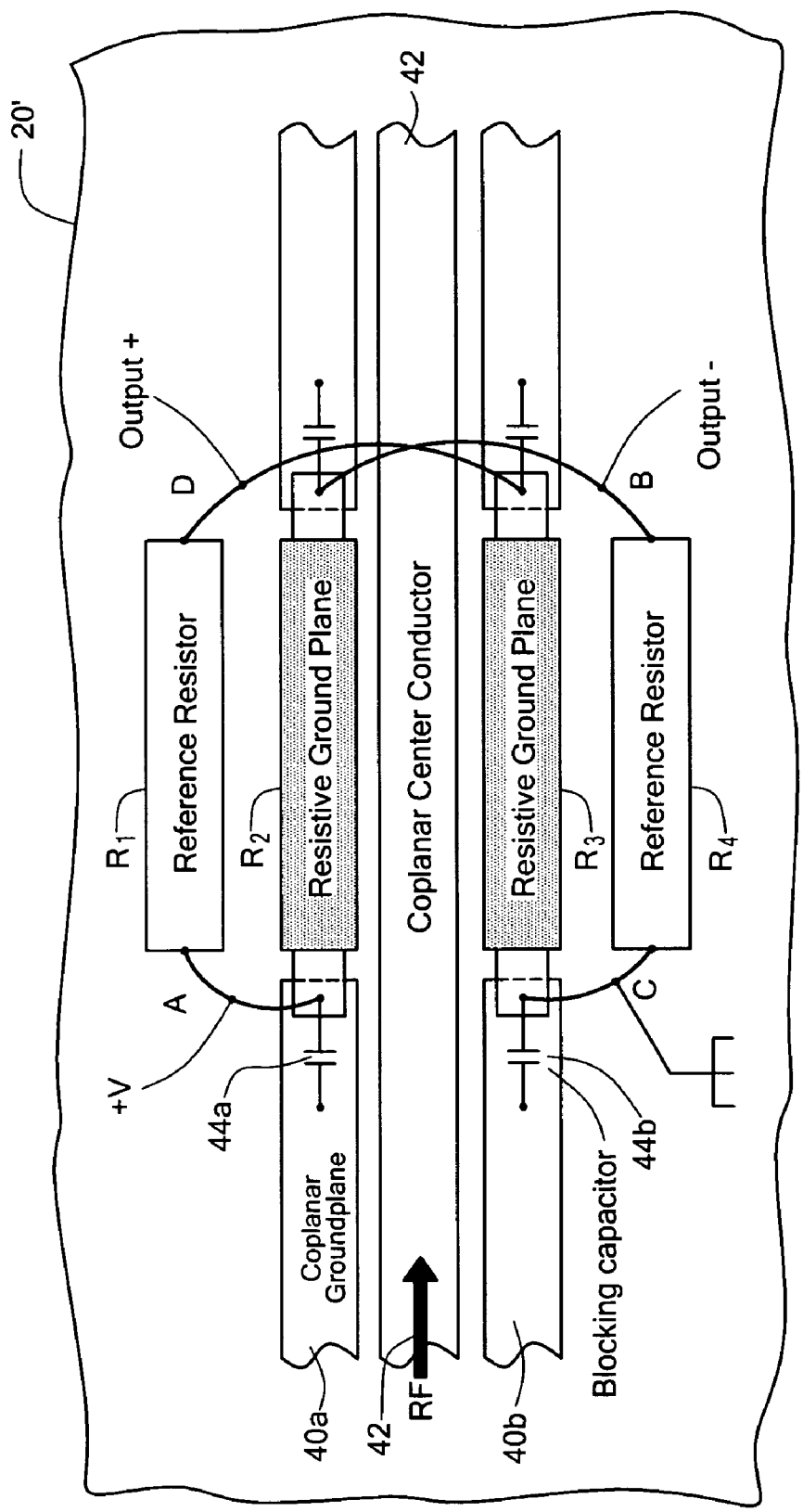
FIG. 5 is a plan view of an RF power detection circuit according to the invention.

A second design for the RF detection bridge is based on a resistive microwave transmission line with integral referenced resistors as shown in FIG. 5. Reference is made to "Coplanar Waveguide Supported by InGaP Membrane-Like Bridge", Proceedings of the 12$^{th}$ Micromechanics Europe Workshop—MME 2001, September 16-18, Cork, (2001)) by T. Lalinský, M. Držík, M. Tomáška, I. Kostič, L. Matay, Ž. Mozolová Š. Haščík. As shown in FIG. 5, the thermal sensor is constructed of lossy coplanar transmission line. The section is suspended over an etched cavity to increase thermal resistance.

Figure 6A:
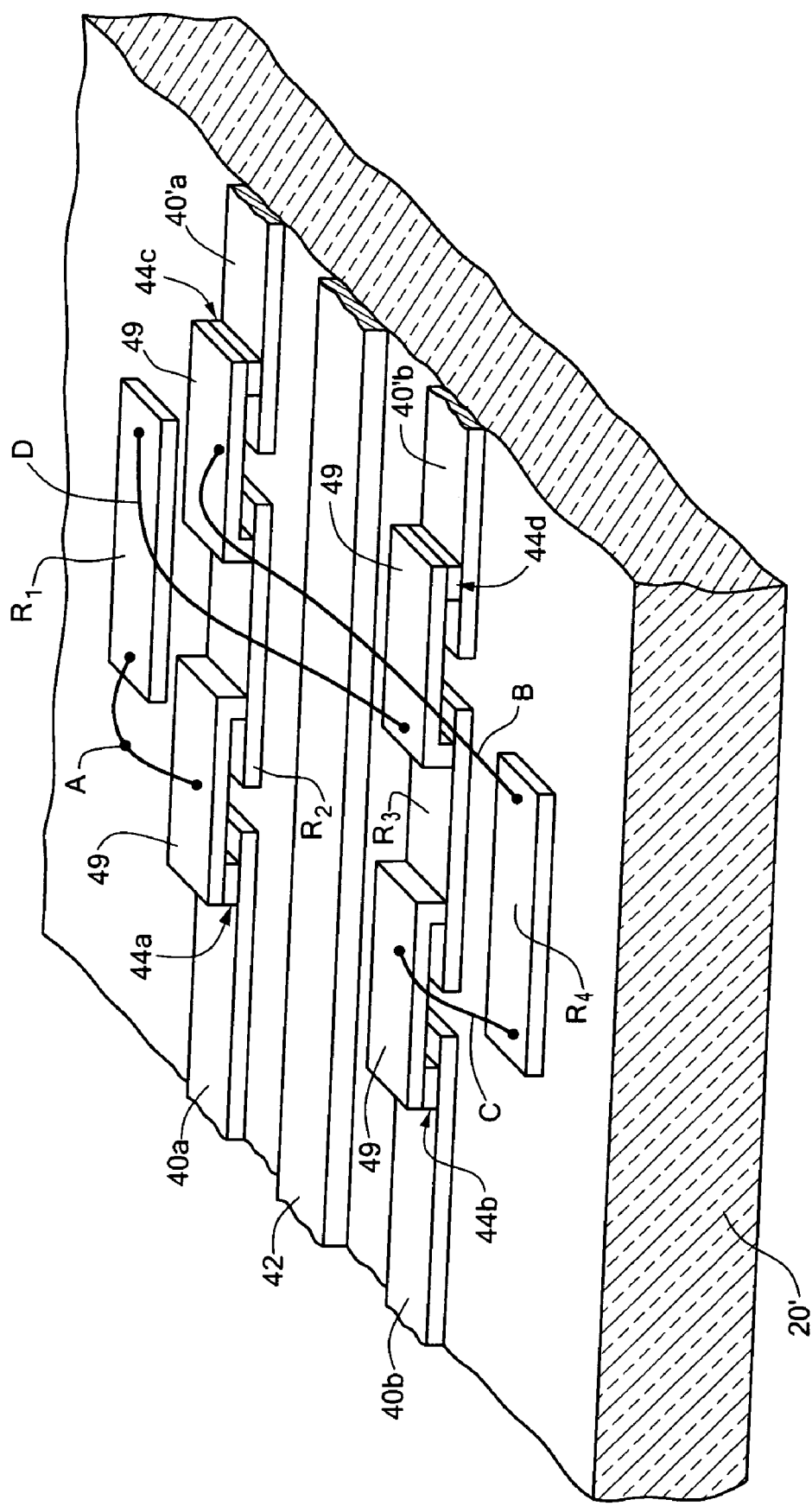
FIG. 6A is an isometric sketch of an RF power detection circuit of FIG. 5.
Figure 6B:
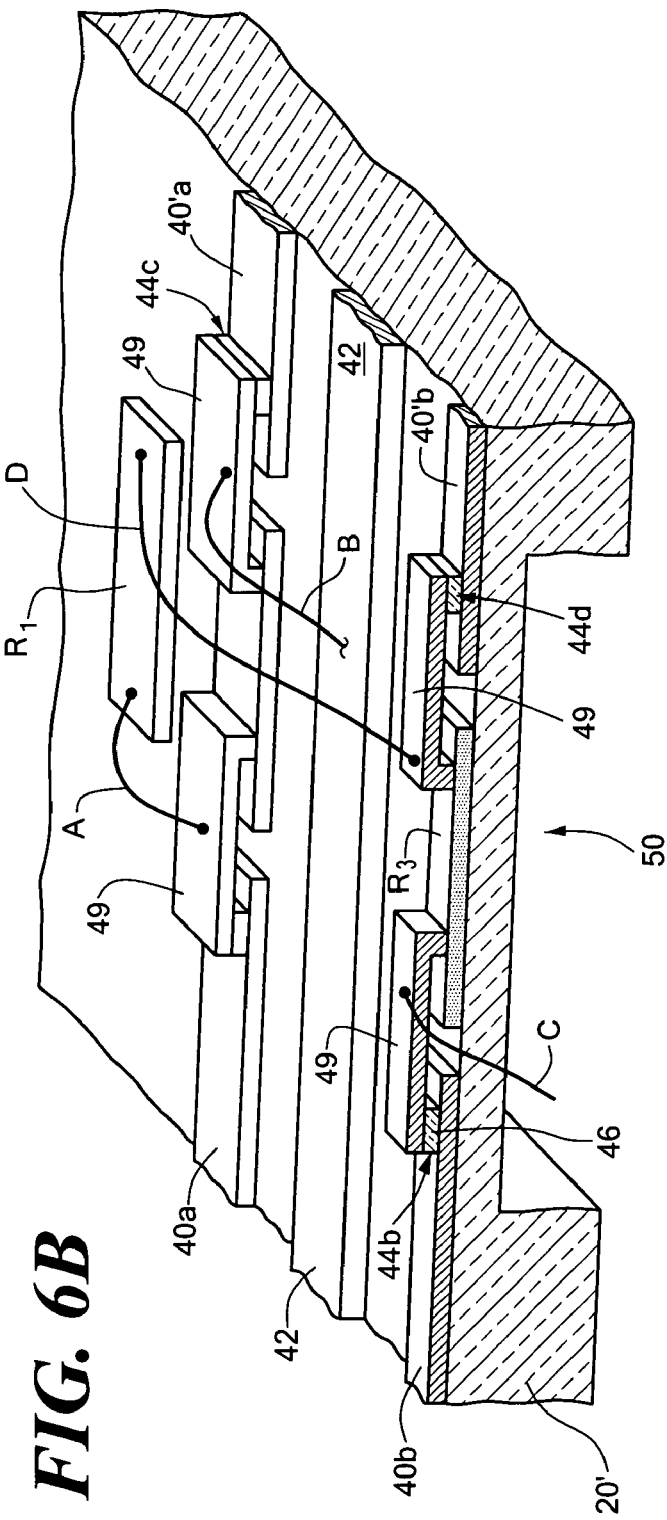
FIG. 6B is a cross-sectional view of the RF power detection circuit of FIG. 6A, such cross section being taken through one of the resistors used in such circuit.
Figure 6C:
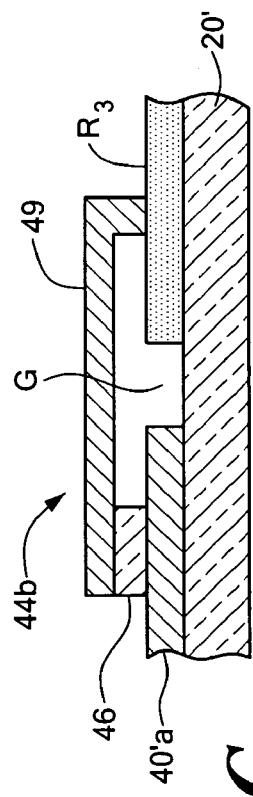
FIG. 6C is a cross sectional sketch of a coupling, dc blocking, capacitor used in the circuit of FIG. 6A.

Thus, referring to FIGS. 5, 6A and 6B, the RF energy enters the detector circuit at the left. The coplanar ground planes 40*a*, 40*b* are interrupted by capacitively, using capacitors 44*a*, 44*b*, isolated resistors R3 and R4, respectively, on either side of the center conductor 42. Above and below the resistive ground planes, is placed a reference resistor, (i.e., resistors R1 and R3, respectively) which is effectively uncoupled from the RF. The reference resistors R1, R3 are wired as shown in the diagram. The "wiring" can be replace by high impedance or inductive lines to RF isolate the reference resistors. On the RF output side, the coplanar ground planes 40'*a*, 40'*b* are interrupted by capacitively, using capacitors 44*c*, 44*d*, isolated resistors R3 and R4, respectively, on either side of the center conductor 42.

Referring to FIG. 6A, a cross sectional sketch of an exemplary one of the RF coupling, dc blocking, capacitors, 44*a*, 44*b*, 44*c* and 44*d*, here capacitor 44*b*. The capacitor 44*b* includes a dielectric 46 disposed between the ground plane 40'*a* and an electrically conductive connector 49 which couples the input RF energy to the resistor R3, According to analysis of the microwave bridge detector, it would be desirable to increase the thermal resistance of the sensor resistors relative to the reference resistors. This can be done by etching a cavity 50 under the coplanar waveguide as in FIG. 6B or by raising the ground plane onto airbridges. Alternatively the reference resistors can be raised onto airbridges in order to modify the relative thermal resistance. A number of embodiments of the invention have been described. Nevertheless, it will be understood that various modifications may be made without departing from the spirit and scope of the invention. For example, while a pair of detector resistors R2, R3 have been shown, only one such resistor need be used. Accordingly, other embodiments are within the scope of the following claims.

What is claimed is:

1. A circuit for measuring power in a source of radio frequency energy, comprising:
   a Wheatstone bridge having a pair of parallel circuit paths disposed between a pair of input nodes, such input nodes being coupled to the source of radio frequency energy, each path having a pair of serially connected elements, each pair of elements in each one of the paths being connected at a corresponding one of a pair of output nodes, at least one element in a first one of the pair of paths being thermally responsive to radio frequency energy from the source of the radio frequency energy passing through said at least one element differently from radio frequency energy from the source of the radio frequency energy passing through at least one other element in the other one of the pair of paths.

2. The circuit recited in claim 1 wherein input nodes are also coupled to a source of dc energy.

3. The circuit recited in claim 2 including a feedback loop responsive to a voltage produced across the output node for providing a control voltage to the first one of the pair of input node.

4. The circuit recited in claim 1 including a feedback loop responsive to a voltage produced across the output node for providing a control voltage to the first one of the pair of input node.

5. A circuit for sensing radio frequency energy, comprising:
   a Wheatstone bridge having a pair of parallel circuit paths disposed between a pair of input nodes, each path having a pair of serially connected elements, each pair of elements in each one of the paths being connected at a corresponding one of a pair of output nodes, at least one element in a first one of the pair of paths being thermally responsive to the radio frequency enemy passing therethrough differently from radio frequency energy passing through at least one other element in the other one of the pair of paths; and,
   wherein the first one of the paths includes a capacitor disposed in shunt with an electrical element having an electrical property varying with the radio frequency energy passing through such electrical element.

6. The circuit recited in claim 5 wherein the electrical property is electrical resistance.

7. A circuit for sensing radio frequency energy, comprising:
   a Wheatstone bridge having a pair of parallel circuit paths disposed between a pair of input nodes, each path having a pair of serially connected elements, each pair of elements in each one of the paths being connected at a corresponding one of a pair of output nodes, at least one element in a first one of the pair of paths being thermally responsive to the power passing therethrough differently from power passing through at least one other element in the other one of the pair of paths;
   wherein a first one of the input nodes is coupled to a source of the radio frequency energy and to a source of dc voltage; and
   a feedback loop responsive to a voltage produced across the output node for providing a control voltage to the first one of the pair of input node.

8. The circuit recited in claim 7 wherein the first one of the paths includes a capacitor disposed in shunt with an electrical element having an electrical property varying with the radio frequency energy passing through such electrical element.

9. The circuit recited in claim 7 wherein the electrical property is electrical resistance.

10. The circuit recited in claim 9 wherein the electrical property is thermal resistance.

11. The circuit recited in claim 9 wherein the electrical property is thermal sensitivity.

12. A method for sensing power comprising:
(A) providing a Wheatstone bridge having:
a pair of parallel circuit paths disposed between a pair of input nodes, each path having a pair of serially connected elements, each pair of elements in each one of the paths being connected at a corresponding one of a pair of output nodes, at least one element in a first one of the pair of paths being thermally responsive to the power passing therethrough differently from power passing through at least one other element in the other one of the pair of paths and wherein a first one of the input nodes is coupled to a source of the radio frequency energy and to a source of dc voltage; and
a feedback loop responsive to a voltage produced across the output node for providing a control voltage to the first one of the pair of input node;
(B) applying a first type of power to the bridge with the feedback loop providing a voltage to the first one of the node and with such bridge being in a balanced condition within the bridge; and
(C) applying a second type of power to the bridge with the bridge becoming imbalanced from such applied second power and with the feedback loop changing the voltage to the first node, such changed voltage providing an indication of the application of the second type of power.

13. The method recited in claim 12 wherein the first type of power is dc power and the second power is RF power.

14. A circuit for sensing radio frequency energy, comprising:
a network having:
four nodes, one pair thereof being input nodes and a pair of different nodes thereof being output nodes; and
a pair of parallel circuit paths disposed between the pair of input nodes, each path having a pair of serially connected elements, each pair of elements in each one of the paths being connected at a corresponding one of the pair of output nodes, at least one element in a first one of the pair of paths being thermally responsive to the radio frequency energy passing therethrough differently from radio frequency energy passing through at least one other element in the other one of the pair of paths; and
wherein a first one of the input nodes is coupled to a source of the radio frequency energy and to a source of dc voltage.

15. The circuit recited in claim 14 including a feedback loop responsive to a voltage produced across the output node for providing a control voltage to the first one of the pair of input node.

16. A circuit for sensing radio frequency energy, comprising:
a network having:
four nodes, one pair thereof being input nodes and a pair of different nodes thereof being output nodes; and
a pair of parallel circuit paths disposed between the pair of input nodes, each path having a pair of serially connected elements, each pair of elements in each one of the paths being connected at a corresponding one of the pair of output nodes, at least one element in a first one of the pair of paths being thermally responsive to the radio frequency energy passing therethrough differently from radio frequency energy passing through at least one other element in the other one of the pair of paths; and
wherein the first one of the paths includes a capacitor disposed in shunt with an electrical element having an electrical property varying with the radio frequency energy passing through such electrical element.

17. The circuit recited in claim 16 wherein the electrical property is electrical resistance.

18. A method for sensing power comprising:
(A) providing a network having:
four nodes, one pair thereof being input nodes and a pair of different nodes thereof being output nodes;
a pair of parallel circuit paths disposed between the pair of input nodes, each path having a pair of serially connected elements, each pair of elements in each one of the paths being connected at a corresponding one of the pair of output nodes, at least one element in a first one of the pair of paths being thermally responsive to the radio frequency energy passing therethrough differently from radio frequency energy passing through at least one other element in the other one of the pair of paths wherein a first one of the input nodes is coupled to a source of the radio frequency energy and to a source of dc voltage; and
a feedback loop responsive to a voltage produced across the output node for providing a control voltage to the first one of the pair of input node;
(B) applying a first type of power to the network with the feedback loop providing a voltage to the first one of the node and with such network being in a balanced condition within the network; and
(C) applying a second type of power to the network with the network becoming imbalanced from such applied second power and with the feedback loop changing the voltage to the first node, such changed voltage providing an indication of the application of the second type of power.

19. The method recited in claim 18 wherein the first type of power is dc power and the second power is RF power.

* * * * *

UNITED STATES PATENT AND TRADEMARK OFFICE
CERTIFICATE OF CORRECTION

| | | |
|---|---|---|
| PATENT NO. | : 7,030,600 B2 | |
| APPLICATION NO. | : 10/701044 | |
| DATED | : April 18, 2006 | |
| INVENTOR(S) | : Michael G. Adlerstein | |

It is certified that error appears in the above-identified patent and that said Letters Patent is hereby corrected as shown below:

Abstract line 4, delete "therethough" and replace with --therethrough--.

Abstract line 5, delete "though" and replace with --through--.

Column 1, lines 14-15 delete "with of a radio" and replace with --with radio--.

Column 1, line 49 delete "therethough" and replace with --therethrough--.

Column 1, line 50 delete "though" and replace with --through--.

Column 1, line 58 delete "though" and replace with --through--.

Column 1, line 59 delete "though" and replace with --through--.

Column 1, lines 66-67 delete "input node." and replace with --input nodes.--.

Column 2, line 15 delete "therethough" and replace with --therethrough--.

Column 2, line 16 delete "though" and replace with --through--.

Column 2, line 21 delete "input node" and replace with --input nodes.--.

Column 2, line 38 delete "though" and replace with --through--.

Column 2, line 39 delete "though" and replace with --through--.

Column 2, line 48 delete "condition the bridge." and replace with

--condition with the bridge.--.

Column 3, line 40 delete "though" and replace with --through.-.

Column 3, line 61 delete "R2 R4." and replace with --R2, R4.--.

Column 4, line 3 delete "power their" and replace with --power, their--.

Column 4, line 38 delete "influence the not only" and replace with

--influence not only--.

Column 4, line 43 delete "to it's thermal" and replace with --to its thermal.--.

UNITED STATES PATENT AND TRADEMARK OFFICE
CERTIFICATE OF CORRECTION

PATENT NO.         : 7,030,600 B2
APPLICATION NO. : 10/701044
DATED                : April 18, 2006
INVENTOR(S)      : Michael G. Adlerstein It is certified that error appears in the above-identified patent and that said Letters Patent is hereby corrected as shown below:

Column 4, line 48 delete "such the design" and replace with --such as the design--.

Column 5, line 45 delete "where $O_2$" and replace with --$k_2$--.

Column 5, line 45 delete "sensitivity temperature and $O_2$" and replace with --sensitivity of $R_2$ to temperature and $O_2$--.

Column 5, line 61 delete "that then resistors" and replace with --than resistors--.

Column 5, line 67 delete "may formed" and replace with --may be formed--.

Column 6, line 3 delete "may fanned" and replace with --may be formed--.

Column 6, line 36 delete "With the only the dc power" and replace with --With only the dc power--.

Column 6, lines 36-37 delete "balanced the voltage" and replace with --balanced and the voltage--.

Column 6, line 49 delete "$\emptyset_2 > \emptyset_4$ Thus," and replace with --$\emptyset_2 > \emptyset_4$ Thus--.

Column 7, line 47 delete "be replace" and replace with --be replaced--.

Column 8, lines 25-26 delete "input node." and replace with --input nodes.--.

Column 8, lines 29-30 delete "input node." and replace with --input nodes.--.

Column 8, line 39 delete "enemy" and replace with --energy--.

Column 8, line 65 delete "input node." and replace with --input nodes.--.

Column 9, line 25 delete "input node;" and replace with --input nodes;--.

Column 9, line 60 delete "input node." and replace with --input nodes.--.

UNITED STATES PATENT AND TRADEMARK OFFICE
CERTIFICATE OF CORRECTION

PATENT NO. : 7,030,600 B2
APPLICATION NO. : 10/701044
DATED : April 18, 2006
INVENTOR(S) : Michael G. Adlerstein It is certified that error appears in the above-identified patent and that said Letters Patent is hereby corrected as shown below:

Column 10, line 45 delete "input node;" and replace with --input nodes;--.

Signed and Sealed this

Second Day of January, 2007

JON W. DUDAS
*Director of the United States Patent and Trademark Office*